United States Patent
Sun et al.

(10) Patent No.: US 11,091,727 B2
(45) Date of Patent: Aug. 17, 2021

(54) POST ETCH RESIDUE CLEANING COMPOSITIONS AND METHODS OF USING THE SAME

(71) Applicant: VERSUM MATERIALS US, LLC, Tempe, AZ (US)

(72) Inventors: Laisheng Sun, Gilbert, AZ (US); Yi-Chia Lee, Chupei (TW); Lili Wang, Chandler, AZ (US); Aiping Wu, Chandler, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/457,119

(22) Filed: Jun. 28, 2019

(65) Prior Publication Data

US 2020/0032177 A1 Jan. 30, 2020

Related U.S. Application Data

(60) Provisional application No. 62/702,633, filed on Jul. 24, 2018.

(51) Int. Cl.
| | | |
|---|---|---|
| *C11D 11/00* | (2006.01) | |
| *B08B 3/08* | (2006.01) | |
| *C11D 7/26* | (2006.01) | |
| *C11D 7/32* | (2006.01) | |
| *H01L 21/02* | (2006.01) | |

(52) U.S. Cl.
CPC ............ *C11D 11/0047* (2013.01); *B08B 3/08* (2013.01); *C11D 7/261* (2013.01); *C11D 7/265* (2013.01); *C11D 7/3218* (2013.01); *C11D 7/3245* (2013.01); *H01L 21/02057* (2013.01)

(58) Field of Classification Search
CPC ..... C11D 11/0047; C11D 7/261; C11D 7/265; C11D 7/3218; C11D 7/3245; C11D 7/267; C11D 7/32; C11D 7/34; C11D 7/263; C11D 17/0008; C11D 3/0073
See application file for complete search history.

(56) References Cited

U.S. PATENT DOCUMENTS

| | | | |
|---|---|---|---|
| 2012/0048295 A1 | 3/2012 | Du | |
| 2013/0296214 A1* | 11/2013 | Barnes | H01L 21/02063 510/176 |

FOREIGN PATENT DOCUMENTS

| | | |
|---|---|---|
| EP | 0068277 A1 | 1/1983 |
| EP | 1063689 A1 | 12/2000 |
| EP | 1139401 A1 | 10/2001 |
| JP | 2015165562 A | 9/2015 |
| WO | 2005093031 A1 | 10/2005 |
| WO | 2008144501 A2 | 11/2008 |
| WO | 2009032460 A1 | 3/2009 |
| WO | 2012009639 A2 | 1/2012 |
| WO | 2016111990 A1 | 7/2016 |
| WO | 2017156304 A1 | 9/2017 |
| WO | 2017007893 A1 | 12/2017 |
| WO | 2018191424 A1 | 10/2018 |

* cited by examiner

*Primary Examiner* — Natasha N Campbell
(74) *Attorney, Agent, or Firm* — William T. Slaven, IV

(57) ABSTRACT

A microelectronic device (semiconductor substrate) cleaning composition is provided that comprises water; oxalic acid, and two or more corrosion inhibitors and methods of using the same.

17 Claims, No Drawings

POST ETCH RESIDUE CLEANING COMPOSITIONS AND METHODS OF USING THE SAME

CROSS-REFERENCE TO RELATED APPLICATIONS

This application claims priority to U.S. Provisional Application 62/702,633, filed Jul. 24, 2018, which is incorporated herein by reference in its entirety.

BACKGROUND OF THE INVENTION

Numerous steps are involved in the fabrication of microelectronic structures. Within the manufacturing scheme of fabricating integrated circuits selective etching of different surfaces of the semiconductor is sometimes required. Historically, a number of vastly different types of etching processes, to selectively remove material, have been successfully utilized to varying degrees. Moreover, the selective etching of different layers, within the microelectronic structure, is considered an important step in the integrated circuit fabrication process.

In the manufacture of semiconductors and semiconductor microcircuits, it is frequently necessary to coat substrate materials with a polymeric organic substance. Examples of some substrate materials include, aluminum, titanium, copper, silicon dioxide coated silicon wafer, optionally having metallic elements of aluminum, titanium, or copper, and the like. Typically, the polymeric organic substance is a photoresist material. This is a material which will form an etch mask upon development after exposure to light. In subsequent processing steps, at least a portion of the photoresist is removed from the surface of the substrate. One common method of removing photoresist from a substrate is by wet chemical means. The wet chemical compositions formulated to remove the photoresist from the substrate should do so without corroding, dissolving, and/or dulling the surface of any metallic circuitry; chemically altering to the inorganic substrate; and/or attacking the substrate itself. Another method of removing photoresist is by a dry ash method where the photoresist is removed by plasma ashing using either oxygen or forming gas such as hydrogen. The residues or by-products remaining on the substrate after plasma ash may be the photoresist itself or a combination of the photoresist, underlying substrate and/or etch gases. These residues or by-products are often referred to as sidewall polymers, veils or fences.

Increasingly, reactive ion etching (RIE), is the process of choice for pattern transfer during via, metal line and trench formation. For instance, complex semi-conductor devices such as advanced DRAMS and microprocessors, which require multiple layers of back end of line interconnect wiring, utilize RIE to produce vias, metal lines and trench structures. Vias are used, through the interlayer dielectric, to provide contact between one level of silicon, silicide or metal wiring and the next level of wiring. Metal lines are conductive structures used as device interconnects. Trench structures are used in the formation of metal line structures. Vias, metal lines and trench structures typically expose metals and alloys such as Al, Al and Cu alloys, Cu, Ti, TiN, Ta, TaN, W, TiW, silicon or a silicide such as a silicide of tungsten, titanium or cobalt. The RIE process typically leaves a residue or a complex mixture that may include re-sputtered oxide material, organic materials from photoresist, and/or antireflective coating materials used to lithographically define the vias, metal lines and or trench structures.

It is possible to remove the polymers (photoresist, and/or antireflective coating materials and post-etch residues) by treatment with aqueous inorganic solutions. One example of such a solution is a dilute solution of sulfuric acid, hydrogen peroxide, ammonium fluoride or chromophosphoric acid (EP 0 068 277). Dilute sulfuric peroxide (DSP) is often used to remove post-etch resist from an aluminum surface. DSP is an aqueous based, dilute solution of sulfuric acid and hydrogen peroxide. The dilution of DSP enables a more controlled cleaning process on an aluminum surface. Small amounts of fluoride compounds, such as, for example, HF, accelerate the etching process, so that these mixtures are preferably employed in spin etchers in the single wafer process. DSP+ is DSP with a fluoride ion source added. (Other acids, such as nitric acid (EP 1 139 401 A1) or phosphoric acid, or ammonium hydrogen phosphate (EP 1 063 689 A1) can also be used in these solutions.) In the case of all these solutions, the AlCu metallisation beneath the polymer is slightly "under-etched", enabling the polymer (or post etch residues or PERs) to be removed mechanically in a first step (lift off). Dissolution of the polymers or PERs then takes place. This process only allows a relatively small process window between complete cleaning and incipient etching of one or more metals thereon, in particular the AlCu. Cleaning of the vias in particular is unsatisfactory in many cases since the short process times are usually insufficient for complete dissolution of the polymers and the $SiO_2$ as the underlying layer is not underetched by the solutions as in the case of AlCu and/or other metals present on the substrate. Additionally, with intentional under-etching of the metal structures under the polymers or PERs, there is a risk that the metal structures are attacked by too much etching (referred to as over etching) that can cause pitting corrosion that damages the metal structures.

It would therefore be desirable to provide a selective cleaning composition and process capable of removing residues such as, for example, remaining photoresist and/or processing residues, such as for example, residues resulting from selective etching using plasmas and/or RIE. Moreover, it would be desirable to provide a selective cleaning composition and process, capable of removing residues such as photoresist (polymers) and etching residue (referred to collectively as "PERs"), that exhibit high selectivity for the PERs as compared to metals, high dielectric constant materials (referred to herein as "high-k"), silicon, silicide and/or interlevel dielectric materials including low dielectric constant materials (referred to herein as "low-k"), such as deposited oxides, that might also be exposed to the cleaning composition. It would be desirable to provide a composition that is compatible with and can be used with such sensitive low-k films as HSQ, MSQ, FOx, black diamond and TEOS (tetraethylsilicate).

Therefore, there is a need for cleaning solutions to clean substrates with improved corrosion protection for aluminum, copper, other metals and other structures and films present on a semiconductor substrate, in which the cleaning solution prevents the pitting corrosion occurring while removing or substantially removing all of the residues from the substrates.

BRIEF SUMMARY OF THE INVENTION

The compositions disclosed herein is related to aqueous compositions used to remove photoresist, etch and ash residue and contaminants from semiconductor substrates without attacking to any undesired extent-metal, low-k dielectric, and/or high-k dielectric materials that might also be exposed to the composition. The compositions and method of this invention remove the photoresist and residues from the substrates without corroding, dissolving, and/or dulling the surface of any metallic circuitry and/or chemically altering the inorganic substrate; and/or attacking the substrate itself. Additionally, the compositions of this invention, provide stable bath life. The compositions of this invention provide stable pH levels and/or consistent and effective cleaning of microelectronic devices after aging, use and/or exposure to air.

In one aspect of the invention a semiconductor substrate cleaning composition comprises water; oxalic acid, and two or more types of corrosion inhibitors selected from the following three types of corrosion inhibitors: (a) amino acids; (b) non-phenolic-type organic acids, non-phenolic-type organic acid salts or other derivatives of non-phenolic-type organic acids, and (c) phenol and derivatives of phenol. In another aspect of the invention, the cleaning composition comprises one or more of said type (a) corrosion inhibitors and one or more of said type (b) corrosion inhibitors. In another aspect, alone with other aspects, the type (a) corrosion inhibitors are selected from glycine, histidine, lysine, alanine, leucine, threonine, serine, valine, aspartic acid, glutamic acid, and arginine. In another aspect, alone with other aspects, the type (a) corrosion inhibitors are selected from glycine, histidine, lysine, alanine, leucine, threonine, serine, valine, aspartic acid, glutamic acid, arginine. Still other amino acids that may be used in the compositions of this invention include cysteine, asparagine, glutamine, isoleucine, methionine, phenylalanine, proline, tryptophan, and tyrosine. In another aspect, alone with other aspects, the type (b) corrosion inhibitors are selected from ascorbic acid and derivatives of ascorbic acid. In another aspect alone or with other aspects of the invention, the cleaning composition comprises one or more of said type (a) corrosion inhibitors and one or more of said type (c) corrosion inhibitors. In another aspect of the invention, alone or with other aspects, said type (c) corrosion inhibitors are selected from catechol, t-butyl catechol, resorcinol, pyrogallol, p-benzenediol, 1,2,4-benzenetriol, and 1,3,5-benzenetriol, gallic acid, and derivatives of gallic acid, and/or cresol, xylenol, salicyl alcohol, p-hydroxybenzyl alcohol, o-hydroxybenzyl alcohol, p-hydroxyphenethyl alcohol, p-aminophenol, m-aminophenol, diaminophenol, p-hydroxybenzoic acid, o-hydroxybenzoic acid, 2,4-dihydroxybenzoic acid, 2-5-dihydroxybenzoic acid, 3,4 dihydroxybenzoic acid and 3,5-dihydroxybenzoic acid. In another aspect of the invention, alone or in other aspects, the cleaning composition comprises one or more of said type (b) corrosion inhibitors and one or more of said type (c) corrosion inhibitors. In another aspect of the invention, alone or with other aspects, the type (c) corrosion inhibitors are selected from catechol, t-butyl catechol, resorcinol, pyrogallol, p-benzenediol, 1,2,4-benzenetriol, and 1,3,5-benzenetriol, gallic acid, and derivatives of gallic acid, and/or cresol, xylenol, salicyl alcohol, p-hydroxybenzyl alcohol, o-hydroxybenzyl alcohol, p-hydroxyphenethyl alcohol, p-aminophenol, m-aminophenol, diaminophenol, p-hydroxybenzoic acid, o-hydroxybenzoic acid, 2,4-dihydroxybenzoic acid, 2-5-dihydroxybenzoic acid, 3,4 dihydroxybenzoic acid and 3,5-dihydroxybenzoic acid. In another aspect of the invention, alone or in other aspects, the cleaning composition comprises water, oxalic acid and one or more of type (a) corrosion inhibitors, one or more of said type (b) corrosion inhibitors and one or more of said type (c) corrosion inhibitors.

In another aspect, alone or with other aspects, the type (b) corrosion inhibitor comprises 2-O-alkyl ascorbic acid ether, 3-O-alkyl ascorbic acid ether, 5-6-O-alkylidene-ascorbic acid, 2-O-alkanoyl-ascorbic acid, 3-O-alkanoyl-ascorbic acid or 6-O-alkanoyl-ascorbic acid. In another aspect of the invention, alone or with other aspects, the cleaning composition comprises from about 20% to about 99.5% water; from about 0.1 to about 10% of oxalic acid, and from about 0.1% to about 15% of one or more corrosion inhibitors. In another aspect of the invention, the cleaning composition is free of substituted or unsubstituted ammonium hydroxide. In one aspect of the invention, alone or with other aspects, the type (c) corrosion inhibitor is selected from gallic acid or derivatives of gallic acid or selected from gallic acid, methyl gallate, phenyl gallate, 3,4,5 triacetoxygallic acid, trimethyl gallic acid methyl ester, ethyl gallate, or gallic acid anhydride.

In another aspect of the invention, alone or with other aspects of the invention, the cleaning composition comprises corrosion inhibitors selected from the group consisting of one or more of gallic acid and gallic acid derivative(s) or one or more ascorbic acid and ascorbic acid derivative(s) or mixtures of one or more of gallic acid or gallic acid derivatives and one or more of ascorbic acid or ascorbic acid derivatives.

In another aspect of the invention, alone or with other aspects of the invention, the cleaning composition may comprise from about 0.1% to about 10% by wt of two or more corrosion inhibitors. In another aspect of the invention, the cleaning composition, alone or with other aspects of the invention, may comprise phenol and/or phenolic derivatives from about 0.1% to about 5% by wt. or from about 0.1% to about 2% by wt. and/or non-phenol-type organic acids or derivatives of non-phenol-type organic acid from about 1% to about 15% by wt. or from about 2% to about 5% by wt. In another aspect of the invention, the cleaning composition, alone or with other aspects of the invention, may comprise one or more non-phenol-type organic acids or derivatives of non-phenol-type organic acids in the composition from about 1% to about 10% by wt and the phenol and/or phenolic derivative are present in the composition from about 0.1% to about 8% by wt. In another aspect of the invention, the cleaning composition of the invention, alone or with other aspects of the invention, comprises water present in the composition is from about 80% to about 99% by wt, or from about 90% to about 99% by wt. In another aspect of the invention, the cleaning composition, alone or with other aspects of the invention, comprises oxalic acid present in the composition from about 0.8% to about 10% by wt., or from about 0.5% to about 6% by wt. In another aspect of the invention, the cleaning composition, alone or with other aspects of the invention, has a pH from 0.1 to 7, or from 0.5 to 3.

In another aspect of the invention, the cleaning composition, alone or with other aspects of the invention, is substantially free of fluorine-containing compounds and peroxides and/or may be substantially free of amines (other than the one or more amino acids), and/or may be substantially free of nitrogen-containing compounds and/or may be substantially free of formic acid and citric acid and/or other components that may be excluded as described below.

In another aspect of the invention is provided a method of cleaning a microelectronic device or semiconductor substrate comprising the step of: contacting one or more microelectronic device or semiconductor substrates with any composition described herein. In another aspect of the invention is provided a method of cleaning a microelectronic device or semiconductor substrate comprising the step of: contacting one or more microelectronic device or semiconductor substrates with a composition comprising water; oxalic acid, and two or more types of corrosion inhibitors selected from the following three types of corrosion inhibitors: (a) amino acids: (b) non-phenolic-type organic acids, non-phenolic-type organic acid salts or other derivatives of non-phenolic-type organic acids, and (c) phenol and derivatives of phenol. The methods of this invention may (further) comprise the steps of: contacting the substrate with any of the cleaning compositions of this invention for from about 0.1 minutes to about 90 minutes at a temperature of from about 20° C. to about 80° C.; and rinsing the cleaned substrate to remove the cleaning composition. The methods of the invention, alone or with other aspects provide etching the metals on the substrate at rates less than 10 Å/min.

The compositions of this invention comprise water, oxalic acid, two or more corrosion inhibitors, and optionally organic solvent, and optionally other components. The compositions may be acidic, that is the compositions may have a pH less than 7.

DETAILED DESCRIPTION OF THE INVENTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted, but also include the partially closed or closed terms of "consisting essentially of" and "consisting of". Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. All percentages are weight percentages and all weight percentages are based on the total weight of the composition (prior to any optional concentration and/or dilution thereof). Any reference to "one or more" includes "two or more" and "three or more" and so on.

Preferred embodiments of this invention are described herein. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 0.1 wt. %, or less than 0.01 wt. %, and most preferably less than 0.001 wt % or less than 0.0001 wt %, or less than 1 ppb. "Substantially free" also includes 0.0000 wt. % and 0 ppb. The term "free of" means 0.0000 wt. % or 0 ppb.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

This invention provides compositions and methods comprising same for selectively removing residues such as, for example, ashed photoresist and/or processing residues from microelectronic devices. In a cleaning method involving articles such as substrates useful for microelectronic devices, typical contaminants to be removed may include, for example, organic compounds such as exposed and ashed photoresist material, ashed photoresist residue, UV- or X-ray-hardened photoresist, C—F-containing polymers, low and high molecular weight polymers, and other organic etch residues: inorganic compounds such as metal oxides, ceramic particles from chemical mechanical planarization (CMP) slurries and other inorganic etch residues; metal containing compounds such as organometallic residues and metal organic compounds; ionic and neutral, light and heavy inorganic (metal) species, moisture, and insoluble materials, including particles generated by processing such as planarization and etching processes. In one particular embodiment, residues removed are processing residues such as those created by reactive ion etching.

Moreover, the ashed photoresist and/or processing residues are typically present on a semiconductor substrate (microelectronic device), that also includes metal (such as copper, aluminum), silicon, silicate and/or interlevel dielectric material such as deposited silicon oxides and derivatized silicon oxides such as HSO, MSQ, FOX, TEOS and Spin-On Glass, and/or high-k materials, such as hafnium silicate, hafnium oxide, barium strontium titanium (BST), $Ta_2O_5$, and TiOz, wherein both the photoresist and/or residues and the metal, silicon, silicide, interlevel dielectric materials and/or high-k materials will come in contact with the cleaning composition. In addition, the composition disclosed herein may exhibit minimal etch rates of certain dielectric materials such as silicon oxide. The composition and method disclosed herein provides for selectively removing residues without significantly attacking one or more of the following: metal(s), silicon, silicon dioxide, interlevel dielectric materials, and/or high-k materials. In one embodiment, the composition disclosed herein may be suitable for structures containing sensitive low k-films. In certain embodiments, the substrate may contain one or more metals, such as, but not limited to, copper, copper alloy, aluminum, aluminum alloy, titanium, titanium nitride, tantalum, tantalum nitride, tungsten, and titanium/tungsten, one or more of which are not attacked by the cleaning composition.

The composition disclosed herein comprises water, oxalic acid, two or more corrosion inhibitors and optionally organic solvent, and other optional components.

Water

The cleaning compositions of the present invention are aqueous-based and, thus, comprise water. In the present invention, water functions in various ways such as, for example, to dissolve one or more solid components of the residue, as a carrier of the components, as an aid in the removal of metallic residue, as a viscosity modifier of the composition, and as a diluent. Preferably, the water employed in the cleaning composition is de-ionized (DI) water.

It is believed that, for most applications, water may comprise an amount in a range having start and end points selected from the following list of weight percents: 20, 50, 55, 65, 80, 85, 86, 87, 88, 90, 92, 93, 95, 96, 97, 98, 99, 99.5, for examples, from about 20% to about 99.5% by wt., or from about 20% to about 99% by wt., or about 50% to about 99% by wt., or from about 65% to about 99% by wt., or from about 80% to about 99% by wt., or from about 85% to about 98% by wt., or from about 88% to about 97% by wt., or from about 88% to about 95% by wt., or from about 85% to about 95% by wt., or from about 90% to about 95% by wt., or from about 88% to about 95% by wt. of water. Other preferred embodiments of the present invention could comprise from about 92% to about 99.5% by wt., or from about 92% to about 99% by wt; or from about 92% to about 97% by wt., or from about 92% to about 95% by wt.; or from about 93% to about 99% by wt., or from about 93% to about 98% by wt., or from about 93% to about 96% by wt. of water. Still other preferred embodiments of the present invention could include water in an amount to achieve the desired weight percent of the other ingredients.

Oxalic Acid

The cleaning compositions of the present invention comprise oxalic acid. It is believed that, for most applications, the composition may comprise oxalic acid in a range having start and end points selected from the following list of weight percents: 0.1, 0.5, 0.8, 1, 1.5, 3, 4, 4.5, 6, 7, 8, 10, 12, 15, for examples, from about 0.1% to about 15% by wt., or from about 0.5% to about 12% by wt., or from about 0.8% to about 10% by wt., or from about 0.8% to about 8% by wt., or from about 0.8% to about 7% by wt., or from about 1% to about 8% by wt., or from about 1% to about 6% by wt., or from about 0.5% to about 6% by wt., or from about 1% to about 4.5% by wt., or from about 1.5% to about 3% by wt., or from about 0.5% to less than 3% or from about 0.5% to less than 4% by wt. of oxalic acid.

Corrosion Inhibitors

The compositions of the present composition comprises two or more than two corrosion inhibitors selected from at least two of the following three types of corrosion inhibitors as follows: (a) one or more amino acids; (b) one or more non-phenolic-type organic acids, non-phenolic-type organic acid salts or other derivatives of non-phenolic-type organic acids, and (c) one or more of phenol and derivatives of phenol.

Examples of the type (a) corrosion inhibitors, that is, amino acids include glycine, histidine, lysine, alanine, leucine, threonine, serine, valine, aspartic acid, glutamic acid, arginine. Still other amino acids that may be used in the compositions of this invention include cysteine, asparagine, glutamine, isoleucine, methionine, phenylalanine, proline, tryptophan, and tyrosine. Some preferred amino acids include glycine, alanine, valine, leucine, isoleucine, histidine. Some preferred amino acids have a molecular weight of less than 135, or less than 132, or less than 119, or less than 100. In some embodiments the preferred amino acids have a pH at the isolectric point between from 5.9 to 7.9, or between from 5.9 to 7.9, or between from 5.9 to 6.9, or between from 5.9 to 6.1 and in some embodiments the molecular weight ranges and the isolectric points are both within combinations of the ranges specified above in any combination.

Examples of the type (b) corrosion inhibitors, that is, the non-phenolic-type organic acids and non-phenolic-type derivatives of organic acids useful as the one or more than one corrosion inhibitors include ascorbic acid and derivatives of ascorbic acid or mixtures thereof. Derivatives of ascorbic acid useful in the compositions of this invention include 2-O-alkyl ascorbic acid ether, 3-O-alkyl ascorbic acid ether, 5-6-O-alkylidene-ascorbic acid, 2-O-alkanoyl-ascorbic acid, 3-O-alkanoyl-ascorbic acid and 6-O-alkanoyl-ascorbic acid. A non-phenolic-type organic acid is an acid that does not have a phenol present in its structure. In preferred embodiments, these corrosion inhibitors may comprise a ringed structure, other than a benzene ring. In some embodiments, these corrosion inhibitors may comprise a heterocyclic ring.

Examples of the type (c) corrosion inhibitors, that is, the phenolic derivatives as corrosion inhibitors useful in this invention include catechol, t-butyl catechol, resorcinol, pyrogallol, p-benzenediol, 1,2,4-benzenetriol, and 1,3,5-benzenetriol, gallic acid, and derivatives of gallic acid, cresol, xylenol, salicyl alcohol, p hydroxybenzyl alcohol, o-hydroxybenzyl alcohol, p-hydroxyphenethyl alcohol, p-aminophenol, m-aminophenol, diaminophenol, p-hydroxybenzoic acid, o-hydroxybenzoic acid, 2,4-dihydroxybenzoic acid, 2-5-dihydroxybenzoic acid, 3,4 dihydroxybenzoic acid and 3,5-dihydroxybenzoic acid. The phenolic derivatives as corrosion inhibitors useful in this invention may be catechol, t-butyl catechol, resorcinol, pyrogallol, p-benzenediol, m-benzenediol, o-benzenediol, 1,2,3-benzenetriol, 1,2,4-benzenetriol, and 1,3,5-benzenetriol, gallic acid, and derivatives of gallic acid. The phenolic derivative compound(s) useful in this invention may have at least two hydroxyl groups. The phenolic derivatives as corrosion inhibitors useful in this invention may be gallic acid, and derivatives of gallic acid. The derivatives of gallic acid include methyl gallate, phenyl gallate, 3,4,5 triacetoxygallic acid, trimethyl gallic acid methyl ester, ethyl gallate, and gallic acid anhydride.

In some embodiments, the corrosion inhibitors in the composition of this invention comprise: (a) one or more amino acids; and either: (b) one or more non-phenolic-type organic acids or derivatives of a non-phenolic-type organic acid or mixtures thereof; or (c) phenol or one or more phenol derivatives and/or mixtures thereof. In some embodiments, the corrosion inhibitors in the composition of this invention comprise (a) and (b). In some embodiments, the compositions of this invention comprise (a) and (c). In still other embodiments, the compositions of this invention comprise (b) and (c). In some embodiments, the corrosion inhibitors in the composition of this invention comprise: (a) one or more amino acids: (b) one or more non-phenolic-type organic acids or derivatives of a non-phenolic-type organic acid or mixtures thereof; and (c) one or more of phenol derivatives and/or phenol. In one embodiment, the corrosion inhibitors comprise one or more of gallic acid and gallic acid derivative(s) or one or more ascorbic acid and ascorbic acid derivative(s). In another embodiment, the compositions of this invention comprise one or more of gallic acid or gallic acid derivatives and one or more of ascorbic acid or ascorbic acid derivatives. In one embodiment, the corrosion inhibitors comprise one or more amino acids and or one or more ascorbic acid and ascorbic acid derivative(s). In another embodiment, the compositions of this invention comprise one or more amino acids, and one or more of gallic acid or gallic acid derivatives. In another embodiment, the compositions of this invention comprise one or more of gallic acid or gallic acid derivatives, one or more of ascorbic acid or ascorbic acid derivatives, and one or more amino acids.

It is believed that the total amount of the one or more corrosion inhibitors or two or more or three or more corrosion inhibitors in any number or combination of the types of corrosion inhibitors (a), (b) and (c) in the cleaning composition of the present invention may be in a range having start and end points selected from the following list of weight percents: 0.1, 0.2, 0.5, 1, 1.5, 2, 3, 4, 5, 6, 7, 8, 10, 12, 15, 18, 20, for examples, from about 0.1% to about 15%, or from about 0.1% to about 10%, or from about 0.1% to about 8%, or from about 0.5% to about 15%, or from about 0.5% to about 10%, or from about 5 to about 12%, or from about 1% to about 8%, or from about 1% to about 6%, or from about 1% to about 5% by weight of the composition.

In other embodiments, the one or more corrosion inhibitors comprising amino acids, if present (type (a) corrosion inhibitors) in the composition (alone or in combination with other types of corrosion inhibitors described above), may be in a range having start and end points selected from the following list of weight percents: 0.1, 0.2, 0.5, 1, 1.5, 2, 3, 4, 5, 6, 7, 8, 10, 12, 15, 18, 20, for examples, from about 0.1% to about 15%, or from about 1% to about 15%, or from about 1% to about 10%, or from about 1% to about 8%, or from about 1% to about 7%, or from about 1% to about 6%, or from about 2% to about 5% by weight of the composition.

In other embodiments, the one or more corrosion inhibitors comprising non-phenolic-type organic acids and/or derivatives of non-phenolic-type organic acids or mixtures thereof, (type (b) corrosion inhibitors), if present in the composition (alone or in combination with other types of corrosion inhibitors described above), may be in a range having start and end points selected from the following list of weight percents: 0.1, 0.2, 0.5, 1, 1.5, 2, 3, 4, 5, 6, 7, 8, 10, 12, 15, 18, 20, for examples, from about 1% to about 15%, or from about 1% to about 10%/o, or from about 1% to about 8%, or from about 1% to about 7%, or from about 1% to about 6%, or from about 2% to about 5% by weight of the composition.

The one or more phenol and/or phenolic derivatives or mixtures thereof (type (c) corrosion inhibitors), if present in the composition (alone or in combination with other types of corrosion inhibitors described above), may be in a range having start and end points selected from the following list of weight percents: 0.1, 0.2, 0.5, 1, 1.5, 2, 3, 4, 5, 6, 7, 8, 10, 12, 15, 18, 20, for examples, from about 0.1% to about 15%, or from about 0.1% to about 10%, or from about 0.1% to about 8%, or from about 0.1% to about 7%, or from about 0.1% to about 5%, or from about 0.1% to about 2%, or from about 0.2% to about 2%, or a positive amount less than 3% by weight of the composition.

In some embodiments, where the composition comprises one or more phenol and/or phenolic derivatives or mixtures thereof and one or more non-phenolic-type organic acids and/or derivatives of non-phenolic-type organic acids or mixtures thereof, the amounts of each are as described in the preceding three paragraphs in any combination, for examples, from about 1% to about 8% of one or more non-phenolic-type organic acids and/or derivatives of non-phenolic-type organic acids or mixtures thereof, and from about 0.1% to about 5% of one or more than one phenol and/or phenol derivatives or mixtures thereof; or from about 0.5% to about 5% of one or more non-phenolic-type organic acids and/or derivatives of non-phenolic-type organic acids or mixtures thereof, and from about 0.1% to about 2% of one or more than one phenol and/or phenol derivatives or mixtures thereof. In other embodiments where the composition comprises any two or three of (a), (b) and (c); (a) being one or more than one amino acids; (b) being one or more non-phenolic-type organic acids and/or derivatives of non-phenolic-type organic acids or mixtures thereof, and (c) being one or more phenol and/or phenolic derivatives or mixtures thereof, the amounts of (a) and/or (b) and/or (c) can be any combination of the amounts in the preceding three paragraphs for the corrosion inhibitors, such as, (a) from about 1% to about 10% of one or more than one amino acids; (b) from about 1% to about 10% of one or more non-phenolic-type organic acids and/or derivatives of non-phenolic-type organic acids or mixtures thereof, and (c) from about 0.1% to about 10% of one or more than one phenol and/or phenol derivatives or mixtures thereof; or alternatively, (a) from about 1% to about 8% of one or more than one amino acids; (b) from about 1% to about 8% of one or more non-phenolic-type organic acids and/or derivatives of non-phenolic-type organic acids or mixtures thereof, and (c) from about 0.1% to about 5% of one or more than one phenol and/or phenol derivatives or mixtures thereof. In yet another example, the composition of this invention may comprise (a) from about 1% to about 5% of one or more than one amino acids; (b) from about 0.5% to about 5 of one or more non-phenolic-type organic acids and/or derivatives of non-phenolic-type organic acids or mixtures thereof, and (c) from about 0.1% to about 5% of one or more than one phenol and/or phenol derivatives or mixtures thereof.

pH

In certain embodiments, the cleaning composition has a pH in a range defined by the following endpoints in any combination: 0.1, 0.5, 0.8, 1, 1.2, 1.5, 2, 2.5, 2.8, 3, 4, 5, 6, 7, for examples, from about 0.1 to about 7, or from about 0.5 to about 5, or from about 0.5 to about 4, or from about 0.5 to about 3, or from about 0.5 to about 2.8, or from about 0.5 to about 2.5 or from about 0.8 to about 2. In some embodiments, the pH is less than 4. In other embodiments, the pH is less than 3. In certain embodiments, compositions that are used for the removal of highly inorganic etch residues and oxide skimming, for example, aluminum oxide skimming, may require a pH ranging from 0.5 to 3. The pH of the compositions can be measured directly using a commercially available pH meter.

Additional Organic Acids (Optional)

The compositions of this invention may comprise additional organic acids (different from the types of corrosion inhibitors listed above), including, glycolic acid, lactic acid, hydroxybutyric acid, glyceric acid, malic acid, tartaric acid, formic acid, citric acid, malonic acid, succinic acid, glutaric acid, maleic acid. Alternatively, the compositions of this invention may be substantially free of, or free of, any or all additional organic acids listed in the preceding sentence in any combination, or substantially free of, or free of all of the additional organic acids. In the latter case, the compositions of this invention may be free or substantially free of glycolic acid, lactic acid, hydroxybutyric acid, glyceric acid, malic acid, tartaric acid, formic acid, citric acid, malonic acid, succinic acid, glutaric acid, and maleic acid. Or alternatively, as non-limiting example of being free of one or more acids in any combination: the compositions of this invention may be substantially free of, or free of formic acid, or citric acid, or formic acid and citric acid. Alternatively, if present, the additional organic acids may be present from about 0.1 to 10% by weight.

Water-Miscible Solvent (Optional)

The etching compositions of the present invention may comprise a water-miscible solvent. Examples of water-miscible organic solvents that can be employed are N-methylpyrrolidone (NMP), 1-methoxy-2-propyl acetate (PG-MEA), ethylene glycol, propylene glycol, butyl diglycol, 1,4-butanediol, tripropylene glycol methyl ether, propylene glycol propyl ether, diethylene gycol n-butyl ether (e.g., commercially available under the trade designation Dowanol DB), hexyloxypropylamine, poly(oxyethylene)diamine, dimethylsulfoxide, tetrahydrofurfuryl alcohol, glycerol, alcohols, sulfoxides, or mixtures thereof. Preferred solvents are alcohols, diols, or mixtures thereof.

In some embodiments of the present invention, the water-miscible organic solvent may comprise a glycol ether. Examples of glycol ethers include ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monethyl ether acetate, propylene glycol methyl ether acetate, propylene glycol monomethyl ether, propylene glycol dimethyl ether, propylene glycol monobutyl ether, propylene glycol, monopropyl ether, dipropylene glycol monomethyl ether, dipropylene glycol monopropyl ether, dipropylene glycol monoisopropyl ether, dipropylene monobutyl ether, diproplylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol.

It is believed that, for most applications, the amount of water-miscible organic solvent in the composition may be in a range having start and end points selected from the following list of weight percents: 0.1, 0.5, 1, 5, 7, 12, 15, 25, 30, 35, 40, 50, 65, 75, 80, 85. Examples of such ranges of solvent include from about 0.5% to about 80% by weight; or from about 0.5% to about 65% by weight; or from about 1% to about 50% by weight; or from about 0.1% to about 30% by weight 0.5% to about 25% by weight; or from about 0.5% to about 15% by weight; or from about 1% to about 7% by weight; or from about 0.1% to about 12% by weight of the composition. When the solvent is present in the compositions of this invention, the total amount of the water and the solvent is preferably more than 70%, or more than 75%, or more than 80%, or more than 85%, or more than 90% of the total composition and/or preferably less than 97%, or less than 96%, or less than 95%, or less than 94% by weight of the composition.

The solvents, if present, may support the cleaning action and to protect the wafer surfaces.

In some embodiments the compositions of this invention will be free of, or substantially free of, any or all of the above-listed water-miscible organic solvents in any combination, or all water-miscible organic solvents added to the composition.

Metal Chelating Agent (Optional)

Another optional ingredient that can be used in the cleaning composition is a metal chelating agent which typically functions to increase the capacity of the composition to retain metals in solution and to enhance the dissolution of metallic residues. Typical examples of chelating agents useful for this purpose are the following organic acids and their isomers and salts: (ethylenedinitrilo)tetraacetic acid (EDTA), butylenediaminetetraacetic acid, (1,2-cyclohexylenedinitrilo-)tetraacetic acid (CyDTA), diethylenetriaminepentaacetic acid (DETPA), ethylenediaminetetrapropionic acid, (hydroxyethyl)ethylenediaminetriacetic acid (HEDTA), N, N,N', N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), gluconic acid, saccharic acid, phthalic acid, mandelic acid, salicylic acid, and 8-hydroxyquinoline. Preferred chelating agents are aminocarboxylic acids such as EDTA, CyDTA and aminophosphonic acids such as EDTMP.

It is believed that, for most applications, if present, the chelating agent will be present in the composition in an amount of from about 0.01 to about 10% by weight, or from about 0.1 wt. % to about 10 wt. %, or from about 0.1 to about 5% by weight, or from about 0.5 wt. % to about 5 wt. % of the composition.

In some embodiments the compositions of this invention will be free of or substantially free of any or all of the above-listed metal chelating agents (in any combination) or all metal chelating agents added to the composition.

Additional Corrosion Inhibitors (Optional)

Examples of additional corrosion-inhibitors include triazole compounds.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

In some other embodiments, the additional corrosion inhibitor is a triazole and is at least one of benzotriazole, o-tolyltriazole, m-tolyltriazole, and p-tolyltriazole.

It is believed that for most applications, if present the additional one or more corrosion-inhibitors will comprise from about 0.1 wt. % to about 15 wt. % of the composition; or from about 0.1 wt. % to about 10 wt. %, or from about 0.5 wt. % to about 5 wt. %, or from about 0.1 wt. % to about 1 wt. % or about 0.5 wt. % to about 5 wt. % of the composition.

In some embodiments the compositions of this invention will be free of or substantially free of any or all of the above-listed additional corrosion inhibitors added to the composition including any or all of the triazole compounds.

Other Optionally Included or Excluded Ingredients

In other embodiments, the compositions may comprise or be substantially free of or free of any or all of: surfactants, chemical modifiers, dyes, biocides.

In some embodiments, the compositions of this invention may be free of or substantially free of at least one, or more than one in any combination, or all of the following, or free of any additional of the following if already present in the composition: all nitrogen-containing compounds except for amino acids, sulfur-containing compounds, bromine-containing compounds, chlorine-containing compounds, iodine-containing compounds, fluorine-containing compounds, halogen-containing compounds, phosphorus-containing compounds, ammonium salts, metal-containing compounds, hydroxylamine or derivatives of hydroxylamine, including N,N-Diethyl hydroxylamine (DEHA), isopropylhydroxylamine, or salts of hydroxylamine, such as hydroxylammonium chloride, hydroxylammonium sulfate, sodium-containing compounds, calcium-containing compounds, alkyl thiols, organic silanes, halide-containing compound, oxidizing agents, peroxides, amines, alkanolamines, buffer species, polymers, inorganic acids, quaternary ammonium compounds, substituted and unsubstituted ammonium hydroxides, amides, amino alcohols, metal hydroxides, and strong bases.

Materials removed with the compositions described herein include ashed photoresists and processing residues known in the art by such names as sidewall polymers, veils, fences etch residue, ash residue and the like. In certain preferred embodiments, the photoresist is exposed, developed, etched and ashed prior to contact with the composition described herein. The compositions disclosed herein are compatible with low-k films such as HSQ (FOx), MSQ, SiLK, etc. The formulations are also effective in stripping ashed photoresists including positive and negative photoresists and plasma etch residues such as organic residues, organometallic residues, inorganic residues, metallic oxides, or photoresist complexes at low temperatures with very low corrosion of tungsten, aluminum, copper, titanium containing substrates. Moreover, the compositions are also compatible with a variety of high dielectric constant materials. For many of the listed metals, for example for Aluminum, copper, or Aluminum and copper alloys, or Tungsten, etc., the etch rates provided by the compositions and methods of this invention may be less than about 10 Å/min, or less than about 8 Å/min, or less than about 6 Å/min, or less than about 5 Å/min. or less than about 4 Å/min, or less than about 3 Å/min, which may be provided at processing temperatures of less than 60° C. or less than 45° C. For Tungsten, the etch rates provided by the compositions and methods of this invention may be less than about 1 Å/min or less than 0.5 Å/min, which may be provided at processing temperatures of less than 60° C. or less than 45° C.

During the manufacturing process, a photoresist layer is coated on the substrate. Using photolithographic process, a pattern is defined on the photoresist layer. The patterned photoresist layer is thus subjected to plasma etch by which the pattern is transferred to the substrate. Etch residues are generated in the etch stage. The patterned substrate is subsequently ashed to form a residue. When the substrates are ashed, the main residues to be cleaned may be etchant residues.

The method described herein may be conducted by contacting (dipping or spraying one at a time or with a plurality of substrates into a bath that is sized to receive the plurality of substrates) a substrate having an organic or metal-organic polymer, inorganic salt, oxide, hydroxide, or complex or combination thereof present as a film or residue, with the described composition. The actual conditions, e.g. temperature, time, etc. depend on the nature and the thickness of the material to be removed. In general, the substrate is contacted or dipped into a vessel containing the cleaning composition of this invention at a temperature ranging from about 20° C. to about 80° C., or from about 20° C. to about 60° C., or from about 20° C. to about 40° C. Typical time periods for exposure of the substrate to the composition may range from, for example, 0.1 to 90 minutes, or 1 to 60 minutes, or 1 to 30 minutes. After contact with the composition, the substrate may be rinsed and then dried. Drying is typically carried out under an inert atmosphere and may include spinning. In certain embodiments, a deionized water rinse or rinse containing deionized water with other additives may be employed before, during, and/or after contacting the substrate with the composition described herein.

EXAMPLES

The following examples are provided to further illustrate the composition and method disclosed herein. Examples of the compositions are set forth in Table I. In Table I, all amounts are given in weight percent and add up to 100 weight percent. The compositions disclosed herein were prepared by mixing the components together in a vessel at room temperature until all solids have dissolved.

The summary of cleaning data are provided in Table II. In this procedure, three patterned wafers, passivation, metal line and Via pattern wafers were used for evaluating cleaning performance of different solutions. Three types of patterned wafer substrates were immersed into the solutions with stirring of 400 rpm at 35° C. 50 min for passivation substrates (passivated Al substrates) and Via substrates (dielectric materials) and 10 minutes for metal lines substrates (AlCu metal lines). After exposure to the exemplary composition, the wafer(s) were rinsed with deionized water and dried with nitrogen gas. The wafers were cleaved to provide an edge then examined using a Hitachi SU-8010 scanning electron microscopy (SEM) on a variety of predetermined locations on the wafer and the results were visually interpreted.

Examples of additional compositions tested are set forth in Table III. In Table III, all amounts are given in weight percent and add up to 100 weight percent. The compositions disclosed herein were prepared by mixing the components together in a vessel at room temperature until all solids had dissolved. The summary of cleaning data prepared and determined as described above using the compositions of Table III is provided in Table IV.

Chloride ions are often deposited on substrates as a result of the dry etch process. To simulate the corrosion of metal on the substrates by those chloride ions in the cleaning compositions, KCl was added to two compositions. The test results are shown in Table V. For this test. 50 ppm KCl was added to Examples 50 and 51. Two metal line substrates were immersed into the solutions with stirring of 400 rpm at 35° C. for 30 minutes. The metal line corrosion was evaluated by a Hitachi SU-8010 scanning electron microscope. Example 51 which contains corrosion inhibitors of ascorbic acid and gallic acid had better protection for copper-aluminum (AlCu) line corrosion.

Table VI lists the pH change of the Example 51 solution (or formulation or composition, used interchangeably) during a batch life test that was carried out by exposing the Example 51 solution to the air at 35° C. with stirring 400 rpm. The results in Table VII showed that even after 48 hours exposed to air at 35° C. the Example 51 solution still had comparable cleaning performance to fresh Example 51 solution.

The summary of etch rates ("ER") are provided in Table VIII. The aged Example 51 solutions were prepared by exposing the solution to the air at 60° C. for 22 hours with stirring at 400 rpm. In all of the following etch rates, measurements were conducted after 10 minutes of exposure at 35° C. In determining the aluminum (contains 2% Cu) and W etch rate, the wafers had a blanket layer of a known thickness deposited upon it. The initial thickness of the wafer was determined using the CDE ResMap 273 Four Point Probe. After determining the initial thickness, test wafers were immersed in the exemplary compositions. After 10 minutes, the test wafers were removed from the test solution, rinsed for three minutes with deionized water and completely dried under nitrogen. The thickness of each wafer was measured, and if necessary, the procedure was repeated on the test wafer. The aging process did not obviously change the etch rates of AlCu substrates and W substrates. Additionally, there was no obvious change in the pH of the solution.

TABLE I

Effect of different inhibitors

| Examples | DI water | Oxalic acid | Gallic acid | Ascorbic acid | Catechol | hydroxylamine | TBC | DEHA |
|---|---|---|---|---|---|---|---|---|
| 50 | 97.5 | 2.5 | | | | | | |
| 50C | 94 | 2.5 | | 3.5 | | | | |
| 50D | 96.5 | 2.5 | 1 | | | | | |
| 50E | 87.5 | 2.5 | | | | | | 10 |
| 50F | 94 | 2.5 | | 10 | | | | |
| 50G | 87.5 | 2.5 | | | 10 | | | |
| 50H | 86.5 | 2.5 | 1 | 10 | | | | |
| 50J | 93 | 2.5 | 1 | 3.5 | | | | |
| 50K | 92 | 2.5 | 1 | | 4.5 | | | |
| 50L | 92.5 | 2.5 | | | | | 5 | |
| 51 | 93.5 | 2.5 | 0.5 | 3.5 | | | | |
| 51B | 95.5 | 2.5 | | | | | 2 | |

TABLE II

Cleaning performance tests

| Examples | metal line | Passivation | Via |
|---|---|---|---|
| 50 | some residues | clean | N/A |
| 50C | clean | clean | N/A |
| 50D | some residues | some residues | N/A |
| 50E | not clean | some residues | N/A |
| 50F | clean | clean | N/A |
| 50G | some residue | some residue | N/A |
| 50H | N/A | N/A | N/A |
| 50J | clean | clean | clean |
| 50K | slight residue | some residue | residue |
| 50L | some residue | some residue | residue |
| 51 | Clean | Clean | Clean |
| 51B | N/A | N/A | N/A |

TABLE III

Effect of other additives

| Examples | DI water | Oxalic acid | Gallic acid | Ascorbic acid | ammonium acetate | lactic acid | DPGME | Sulfolane | citric acid |
|---|---|---|---|---|---|---|---|---|---|
| 50M | 93 | 2.5 | 1 | | 3.5 | | | | |
| 50N | 95 | 2.5 | | | | 2.5 | | | |
| 50T | 73.5 | 2.5 | 0.5 | 3.5 | | | 20 | | |
| 50U | 73.5 | 2.5 | 0.5 | 3.5 | | | | 20 | |
| 50W | 83.5 | 2.5 | 0.5 | 3.5 | | | 10 | | |
| 50X | 89 | 2.5 | | 3.5 | | | | | 5 |

TABLE IV

Cleaning tests of solutions with other additives

| Examples | Metal line | Passivation | Via |
|---|---|---|---|
| 50M | residue | not clean | not clean |
| 50N | N/A | some residue | N/A |
| 50T | clean | clean | clean |
| 50U | clean | slight residue | clean |
| 50W | clean | clean | clean |
| 50X | clean | some residue | clean |

TABLE V

Effect of Chlorine ion in solution on metal line corrosion

| Substrate | Cl⁻ concentration | Example 50 | Example 51 |
|---|---|---|---|
| Metal line 1 | 50 ppm | Obvious corrosion | No obvious corrosion |
| Metal line 2 | 50 ppm | Obvious corrosion | No obvious corrosion |

TABLE VI pH change of Example 51 bath life tests at 35° C.

| Bath life time/hr | pH |
|---|---|
| 0 | 1.19 |
| 6 | 1.04 |
| 13 | 1.06 |
| 20 | 1.08 |
| 27 | 1.08 |
| 34 | 1.06 |
| 41 | 1.06 |
| 48 | 1.04 |

TABLE VII

Cleaning tests using bath life tested solutions

| Time hr | Metal line | passivation | Via |
|---|---|---|---|
| 0 | Clean | Clean | Clean |
| 24 | Clean | Clean | Clean |
| 48 | Clean | Clean | Clean |

TABLE VIII

Etch rate test results of fresh and aged solutions at 35° C.

| | Aging | pH | AlCu Å/min | W Å/min |
|---|---|---|---|---|
| 51 | Fresh | 0.90 | 2.8 | 0.3 |
|  | Aged | 0.94 | 1.6 | 0.2 |
| 50 | Fresh | 1.05 | 1.6 | 0.2 |

Table IX showed the AlCu etch rates of Example 50 and 51 at 50° C. and 60° C. Both Example 50 and 51 showed obviously higher AlCu etch rates above 50° C. than at 35° C. Longer processing time also resulted in higher AlCu etch amount. Table X showed the AlCu metal lines were either corroded or severely corroded when the substrates were treated by Example 50 and 51 at above 50° C.

Table XI showed the effect of additional inhibitors in Example 51 on AlCu etch rates. Among those inhibitors the addition of L-Histidine showed the significant decrease of AlCu etch rates at 60° C. The addition of glycine into Example 50 also showed the decrease of AlCu etch rates at 50° C.

Table XII showed the formulations with other additional additives along with additional inhibitor glycine. From Example 51M and 51R. The AlCu etch rates were decreased at 50° C. compared to Example 50 and 51. Table XIII shows the cleaning performance and the AlCu metal line corrosion for the formulations in Table XII.

TABLE IX

Etch rate tests at different temperatures

| Formulation | Temp/° C. | Time/min | AlCu ER Å/min |
|---|---|---|---|
| 50 | 35 | 20 | 1.6 |
|  | 35 | 10 | 0.5 |
|  | 50 | 10 | 4.1 |
|  | 60 | 10 | 19.6 |
| 51 | 35 | 20 | 2.8 |
|  | 50 | 10 | 4.1 |
|  | 60 | 10 | 16.6 |
|  | 60 | 20 | 25.9 |

TABLE X

Cleaning tests and metal line corrosion at different temperatures

| Examples | Temp ° C. | Time min | Metal line clean | Metal line corrosion |
|---|---|---|---|---|
| 50 | 50 | 10 | Clean | Corrosion |
|  | 50 | 30 | Clean | Severe corrosion |
|  | 60 | 10 | Clean | Severe corrosion |
|  | 60 | 30 | N/A | Complete corrosion |
|  | 35 | 30 | Clean | Corrosion |
| 51 | 50 | 10 | Clean | Corrosion |
|  | 50 | 30 | Clean | Severe corrosion |
|  | 60 | 10 | Clean | Severe corrosion |
|  | 60 | 30 | N/A | Complete corrosion |
|  | 35 | 30 | Clean | Corrosion |

TABLE XI

The effect of additives added to the Example 51 formulation on the AlCu etch rates

| Additives in Formulation 51 | Conc wt % | AlCu etch rate at 60° C. Å/min |
|---|---|---|
| None | 0 | 16.7 |
| BZT | 0.50% | 15 |
|  | 1.00% | 17 |
| L-Histidine | 0.125% | 14.7 |
|  | 0.250% | 11.5 |
|  | 0.500% | 11.2 |
|  | 1.00% | 9.4 |
|  | 1.50% | 7.9 |
|  | 1.50% | 2.3 @50° C. |
| Sorbitol | 1% | 17.4 |
|  | 2% | 17.5 |
| EDTA | 0.25% | 18.4 |
| AEE | 0.25% | 15.3 |
|  | 0.5% | 18.0 |

TABLE XII

The effect of glycine added to the Example 50 formulation on the AlCu etch rates

| Glycine % in Formulation 50 | AlCu etch rate at 50° C. Å/min |
|---|---|
| None | 4.1 |
| 1% | 2.4 |
| 2% | 1.5 |
| 3% | 0.7 |
| 4% | 0.5 |
| 6% | <0.2 |

TABLE XIV

Cleaning tests of solutions with glycine and other additives

| Examples | Temp ° C. | Time min | Metal line clean | Metal line corrosion |
|---|---|---|---|---|
| 50 | 50 | 10 | Clean | Corrosion |
|  | 50 | 30 | Clean | Severe corrosion |
|  | 60 | 10 | Clean | Severe corrosion |
|  | 60 | 30 | N/A | Complete corrosion |
|  | 35 | 30 | Clean | Corrosion |
| 51 | 50 | 10 | Clean | Corrosion |
|  | 50 | 30 | Clean | Severe corrosion |
|  | 60 | 10 | Clean | Severe corrosion |
|  | 60 | 30 | N/A | Complete corrosion |
|  | 35 | 30 | Clean | Corrosion |
| 51M | 50 | 10 | Clean | No corrosion |
|  | 50 | 30 | clean | corrosion |
|  | 60 | 10 | clean | corrosion |
|  | 60 | 30 | Clean | Severe corrosion |
| 51O | 50 | 10 | Clean | No corrosion |
|  | 50 | 20 | Clean | Slight corrosion |
|  | 50 | 30 | Clean | Corrosion |
| 51P | 50 | 10 | Clean | No corrosion |
|  | 50 | 20 | Clean | Slight corrosion |
|  | 50 | 30 | Clean | Corrosion |
| 51Q | 50 | 10 | Clean | No corrosion |
|  | 50 | 20 | Clean | Slight corrosion |
|  | 50 | 30 | Clean | Corrosion |
| 51R | 50 | 10 | Clean | No corrosion |
|  | 50 | 20 | Clean | No corrosion |
|  | 50 | 30 | Clean | Slight Corrosion |
| 51S | 50 | 10 | Clean | No corrosion |
|  | 50 | 30 | Clean | No corrosion |
| 51T | 50 | 10 | Clean | No corrosion |
|  | 50 | 30 | Clean | slight corrosion |
| 51U | 35 | 10 | N/A | Complete corrosion |
| 51V | 35 | 10 | N/A | Complete corrosion |
| 51Y | 35 | 10 | Clean | No corrosion |
|  | 35 | 30 | Clean | Severe corrosion |
| 51Z | 35 | 10 | Clean | Corrosion |
|  | 35 | 30 | N/A | Complete corrosion |

Where: "No corrosion" means no corrosion, AlCu surface is smooth. "Slight corrosion" means no AlCu line etch back from the edge, but slight AlCu rough surface. "Corrosion" means slight AlCu line etch back from the edge and AlCu rough surface. "Severe corrosion" means AlCu line etch back obviously from the edge, at least ⅕ of total line width and AlCu line rough surface. "Complete corrosion" means AlCu line was completely etched away from the substrate.

TABLE XIII formulations with addition of inhibitors for AlCu etch

|  | 51M | 51N | 51O | 51P | 51Q | 51R | 51S | 51T | 51U | 51V | 51W | 51Y | 51Z | 52A |
|---|---|---|---|---|---|---|---|---|---|---|---|---|---|---|
| Oxalic acid | 4.9 | 8 | 2.5 | 5 | 5 | 3.8 | 5 | 5 | 5 | 5 | 2.5 | 2.5 | 2.5 | 2.5 |
| gallic acid |  |  | 0.5 | 0.5 | 0 | 0 | 0 | 0 | 0 | 0 | 0 | 0 | 0 | 0 |
| ascorbic acid |  |  | 3.5 | 3.5 | 3.5 | 2.6 | 4 | 3.5 | 3.5 | 3.5 | 3.5 | 3.5 | 3.5 | 3.5 |
| glycine | 2.4 | 6 | 3 | 3 | 5 | 3.8 | 5 | 5 | 5 | 5 | 3 | 3 | 3 | 3 |
| water | 92.7 | 86 | 91 | 88 | 67 | 59 | 67 | 77 | 86 | 86 | 91 | 91 | 91 | 91 |
| DMAC |  |  |  |  |  |  | 20 | 10 |  |  |  |  |  |  |
| DPGME |  |  |  |  | 20 | 30.8 |  |  |  |  |  |  |  |  |
| NH4F |  |  |  |  |  |  |  |  | 0.2 | 0.8 | 0.005 | 0.010 | 0.015 | 0.020 |
| pH |  |  | 2.2 | 1.8 | 1.9 | 2.1 |  |  |  |  |  |  |  |  |
| Å/min at 50° C. 10 min | 0.7 |  | 0.8 | 0.1 | 0.2 | 0.6 |  |  | >100 | >100 |  |  |  |  |
| Å/min at 50° C. 20 min |  |  | 2.7 | 2.6 | 0.8 | 1.1 |  |  |  |  |  |  |  |  |
| Å/min at 60° C. 10 min |  |  |  |  | 2.5 | 2 |  |  |  |  |  |  |  |  |
| Å/min at 60° C. 20 min |  |  |  |  | 22 | 12.4 |  |  |  |  |  |  |  |  |

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

We claim:

1. A semiconductor substrate cleaning composition comprising
   a. water;
   b. about 2.0 wt % to about 5.0 wt % of oxalic acid, and
   c. a combination of corrosion inhibitors comprising:
      (i) about 0.1 wt % to about 5 wt % of one or more amino acids selected from the group of histidine and glycine; and
      (ii) about 0.5 wt % to about 10 wt % of one or more non-phenolic type organic acid selected from the group of ascorbic acid and derivatives of ascorbic acid, and (iii) about 0.1 wt % to about 1 wt % of one or more phenolic type organic acid selected from the group of gallic acid and derivatives of gallic acid.

2. The cleaning composition of claim 1, wherein the one or more amino acids consists of both histidine and glycine.

3. The cleaning composition of claim 1, wherein the one or more amino acids consists of histidine.

4. The cleaning composition of claim 1, wherein the one or more non-phenolic type organic acid comprises from about 3.0 wt % to about 10 wt % of ascorbic acid.

5. The cleaning composition of claim 1, wherein the one or more non-phenolic type organic acid comprises about 3.5 wt % of ascorbic acid.

6. The cleaning composition of claim 1, wherein the one or more amino acids consists of glycine.

7. The cleaning composition of claim 1, wherein the one or more phenolic type organic acid comprises from about 0.5 wt % to about 1 wt % of gallic acid.

8. The cleaning composition of claim 1, wherein the one or more phenolic type organic acid comprises about 0.5 wt % of gallic acid.

9. The cleaning composition of claim 1, wherein the cleaning composition comprises
   a about 2.5 wt % to about 5 wt % of oxalic acid;
   (ii) about 3.0 wt % of glycine;
   (iii) about 3.5 wt % of ascorbic acid; and
   (iv) about 0.5 wt % of gallic acid.

10. The cleaning composition of claim 9, wherein the cleaning composition comprises
    (i) about 2.5 wt % of oxalic acid.

11. The cleaning composition of claim 9, wherein the cleaning composition comprises
    (i) a about 5 wt % of oxalic acid one or more type (b) corrosion inhibitors is selected from ascorbic acid and derivatives of ascorbic acid.

12. The cleaning composition of claim 1, wherein the cleaning composition comprises type (a) corrosion inhibitor is from about 2.5 wt % to about 3.5 wt % of the one or more amino acids.

13. The cleaning composition of claim 1, wherein the one or more amino acids comprises type (a) corrosion inhibitor is from about 2.5 w t% to about 3.5 wt % of glycine one or more amino acids.

14. The cleaning composition of claim 1, wherein the one or more amino acids comprises about 3.0 wt % of glycine.

15. The cleaning composition of claim 1, wherein the cleaning composition comprises about 2.0 wt % to about 3.0 wt % of oxalic acid.

16. The cleaning composition of claim 1, wherein the cleaning composition comprises about 2.5 wt % of oxalic acid.

17. A method of cleaning a microelectronic device or semiconductor substrate comprising the step of: contacting one or more microelectronic device or semiconductor substrates with the cleaning composition of claim 1.

* * * * *